US011990315B2

(12) United States Patent
Franken et al.

(10) Patent No.: US 11,990,315 B2
(45) Date of Patent: May 21, 2024

(54) MEASUREMENT AND CORRECTION OF OPTICAL ABERRATIONS IN CHARGED PARTICLE BEAM MICROSCOPY

(71) Applicant: FEI Company, Hillsboro, OR (US)

(72) Inventors: Erik Franken, Nuenen (NL); Bart Jozef Janssen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/683,076

(22) Filed: Feb. 28, 2022

(65) Prior Publication Data

US 2023/0274908 A1 Aug. 31, 2023

(51) Int. Cl.
*H01J 37/28* (2006.01)
*H01J 37/153* (2006.01)

(52) U.S. Cl.
CPC ............ *H01J 37/28* (2013.01); *H01J 37/153* (2013.01); *H01J 2237/1532* (2013.01); *H01J 2237/1534* (2013.01); *H01J 2237/20207* (2013.01); *H01J 2237/2802* (2013.01); *H01J 2237/2817* (2013.01)

(58) Field of Classification Search
CPC .. H01J 37/00; H01J 37/02; H01J 37/26; H01J 37/28; H01J 37/153; H01J 2237/1532; H01J 2237/1534; H01J 2237/20207; H01J 2237/2802; H01J 2237/2817; H01J 2237/1506; H01J 2237/282
USPC .............................. 250/306, 307, 311, 492.2
See application file for complete search history.

(56) References Cited

U.S. PATENT DOCUMENTS 9,564,291 B1 * 2/2017 Own ...................... C23C 14/24

OTHER PUBLICATIONS

Barthel, "Ultra-Precise Measurement of Optical Aberrations for Sub-Ångström Transmission Electron Microscopy," Ph.D. Thesis, Institute for Microstructure Research, 233 pp. (Mar. 2007).
De Jong et al., "Measurement of Electron-Optical Parameters for High-Resolution Electron Microscopy Image Interpretation," *Signal and Image Processing in Microscopy and Microanalysis*, pp. 95-103 (Jan. 1992).
Steinecker et al., "Measurement of lens aberrations by means of image displacements in beam-tilt series," *Ultramicroscopy*, vol. 81, pp. 149-161 (Apr. 2000).
European Patent Office, Extended European Search Report for related European Patent Application No. 23158474.9, dated Jul. 21, 2023.

* cited by examiner

*Primary Examiner* — Jason L McCormack
(74) *Attorney, Agent, or Firm* — Klarquist Sparkman, LLP

(57) ABSTRACT

A charged particle beam microscope system is operated in a transmission imaging mode. During the operation, the charged particle beam microsystem directs a charged particle beam to the sample to produce images. A time series of beam tilts is applied in a pattern to the charged particle beam directed to the sample to produce a sequence of images. At least some of the images in the sequence of images are captured while the charged particle beam is transitioning between one beam tilt in the time series of beam tilts and a sequentially adjacent beam tilt in the time series of beam tilts. The pattern is configured to induce image changes between the images in the sequence of images that are indicative of optical aberrations in the charged particle beam microscope system.

20 Claims, 9 Drawing Sheets

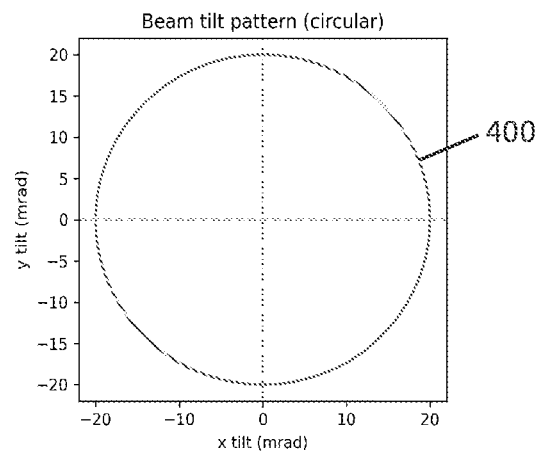
FIG. 4A
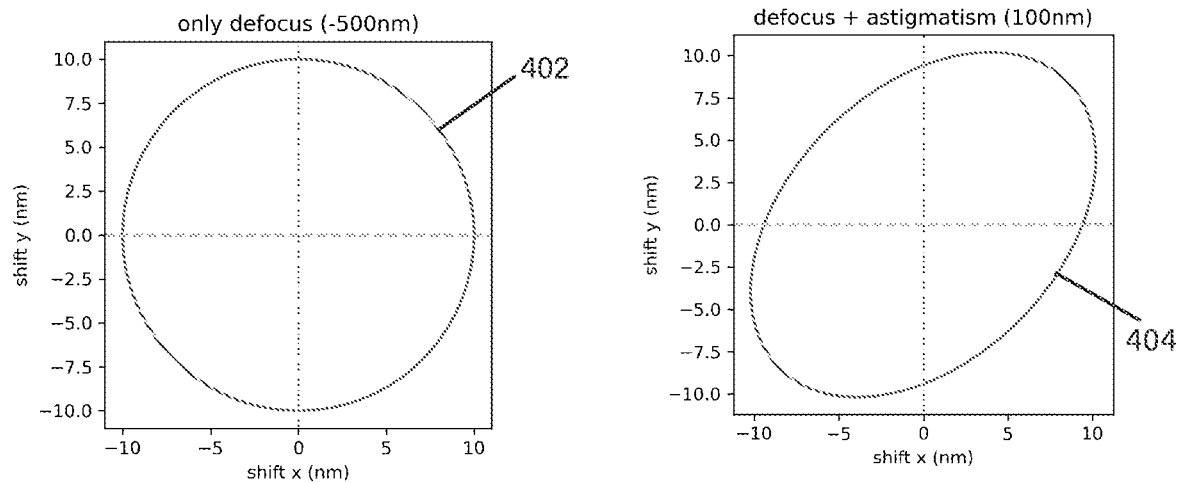
FIG. 4B
FIG. 4C
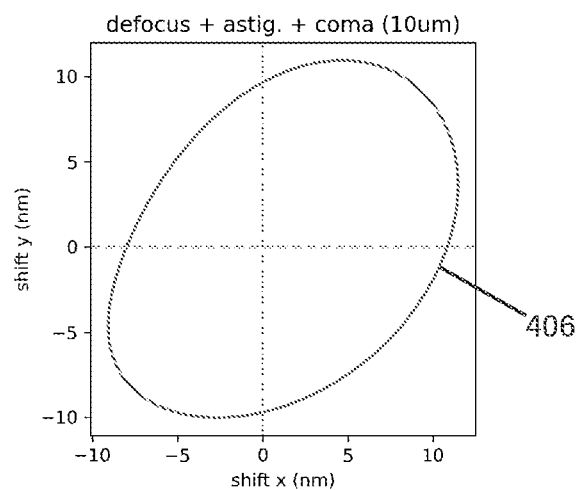
FIG. 4D

MEASUREMENT AND CORRECTION OF OPTICAL ABERRATIONS IN CHARGED PARTICLE BEAM MICROSCOPY

FIELD

The field relates to charged particle beam microcopy.

BACKGROUND

Transmission electron microscopy (TEM) is a technique in which a beam of electrons is transmitted through a thin sample to form an image. The image is formed by the interaction of the electrons with atoms of the sample as the electrons are transmitted through the sample. The image can be captured by a camera. TEM is capable of producing high resolution images due to the small wavelength of the transmitted electrons. Sufficiently high resolution images can be used to investigate and analyze the structural details of the sample on an atomic scale. However, optical aberrations in the microscope can limit the resolution of the images.

BRIEF DESCRIPTION OF THE DRAWINGS

FIG. 4A is a graph of a circular beam tilt pattern.

FIG. 4B is a graph of expected induced image shift produced by the circular pattern depicted in FIG. 4A when there is defocus in the charged particle beam microscope system.

FIG. 4C is a graph of expected induced image shift produced by the circular pattern depicted in FIG. 4A when there is defocus and astigmatism in the charged particle beam microscope system.

FIG. 4D is a graph of expected induced image shift produced by the circular pattern depicted in FIG. 4A when there is defocus, astigmatism, and coma in the charged particle beam microscope system.

DETAILED DESCRIPTION

Figure 1:
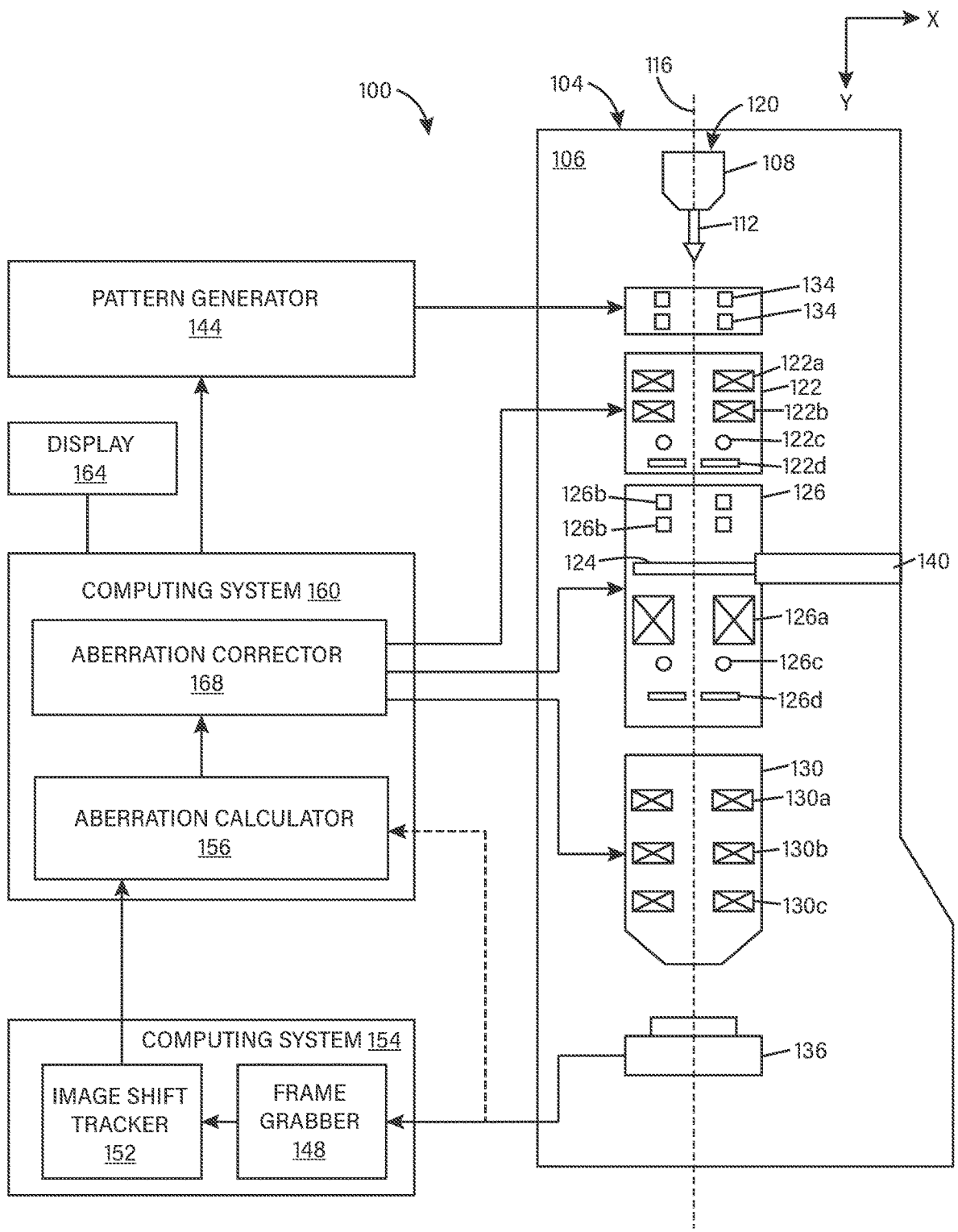
FIG. 1 is a block diagram of a system for measuring and correcting optical aberrations in a charged particle beam microscope system operating in a transmission imaging mode, in accordance with various implementations.

The subject matter disclosed herein pertains to methods and systems that measure and correct optical aberrations in charged particle beam microscope systems, e.g., operating in a transmission imaging mode. Examples of optical aberrations that can be measured and corrected include, but are not limited to, defocus, two-fold astigmatism, three-fold astigmatism, four-fold astigmatism, five-fold astigmatism, six-fold astigmatism, axial coma, fifth order axial coma, spherical aberration, sixth order spherical aberration, star aberration, sixth order star aberration, three-lobe aberration, and rosette aberration.

In one or more implementations, a system includes a charged particle source that emits a charged particle beam, an optical system defining an optical axis and including one or more optical components configured to form the charged particle beam into a field of view of a sample disposed along the optical axis, a pattern generator configured to generate a pattern, one or more beam deflectors disposed along the optical axis and controllable by the pattern to apply a time series of beam tilts to the charged particle beam, and an imaging sensor positioned along the optical axis to capture images of the sample.

In one or more implementations, while operating the charged particle beam microscope system in a transmission imaging mode and directing a charged particle beam to a sample, a time series of beam tilts is applied in a pattern to the charged particle beam to produce a sequence of images. At least some of the images in the sequence of images are captured while the charged particle beam is transitioning between one beam tilt in the time series of beam tilts and a sequentially adjacent beam tilt in the time series of beam tilts. In one or more examples, the sequence of images can be analyzed to determine optical aberrations in the microscope system.

In one or more examples, the pattern is configured such that the beam tilts induce image changes (e.g., image shifts) in the sequence of images that can be correlated to optical aberrations in the microscope system. In one or more examples, image changes can be determined from the sequence of images and used to estimate one or more optical aberration values for the microscope system. In other examples, one or more optical aberration values can be determined by a trained neural network that receives the sequence of images or information derived from the sequence of images (e.g., power spectra of the images) as input data.

In one or more examples, the beam tilt pattern can be a periodic pattern, such as a Lissajous figure. The use of periodic patterns can make it possible to determine an unknown time delay and unknown deviation in frequency of the applied beam tilt pattern in relation to the measured image changes over time. The periodic patterns can also enable a system that is robust against other effects that can induce image changes (e.g., specimen drift and mechanical vibrations), allowing signal processing to be used to separate the different signal sources.

The subject matter is described with implementations and examples. In some cases, as will be recognized by one skilled in the art, the disclosed implementations and examples may be practiced without one or more of the disclosed specific details, or may be practiced with other methods, structures, and materials not specifically disclosed herein. All the implementations and examples described herein and shown in the drawings may be combined without any restrictions to form any number of combinations, unless the context clearly dictates otherwise, such as if the proposed combination involves elements that are incompatible or mutually exclusive. The sequential order of the acts in any process described herein may be rearranged, unless the context clearly dictates otherwise, such as if one act requires the result of another act as input.

In the interest of conciseness, and for the sake of continuity in the description, same or similar reference characters may be used for same or similar elements in different figures, and description of an element in one figure will be deemed to carry over when the element appears in other figures with the same or similar reference character. In some cases, the term "corresponding to" may be used to describe correspondence between elements of different figures. In an example usage, when an element in a first figure is described as corresponding to another element in a second figure, the element in the first figure is deemed to have the characteristics of the other element in the second figure, and vice versa, unless stated otherwise.

The word "comprise" and derivatives thereof, such as "comprises" and "comprising", are to be construed in an open, inclusive sense, that is, as "including, but not limited to". The singular forms "a", "an", "at least one", and "the" include plural referents, unless the context dictates otherwise. The term "and/or", when used between the last two elements of a list of elements, means any one or more of the listed elements. The term "or" is generally employed in its broadest sense, that is, as meaning "and/or", unless the context clearly dictates otherwise. When used to describe a range of dimensions, the phrase "between X and Y" represents a range that includes X and Y. As used herein, an "apparatus" may refer to any individual device, collection of devices, part of a device, or collections of parts of devices.

FIG. 1 illustrates a system 100, according to one implementation, that can measure and correct optical aberrations in a charged particle beam microscope system while the charged particle beam microscope system is operating in a transmission imaging mode. The system 100 is illustrated in the context of an exemplary charged particle beam microscope system 104. However, the system 100 is not limited to the particular configuration of the charged particle beam microscope system 104 shown in FIG. 1 and could be used with any charged particle beam microscope system operating in a transmission imaging mode.

In the illustrated example, the charged particle beam microscope system 104 includes a charged particle beam microscope column 120 (hereafter, microscope column 120) enclosed in a vacuum chamber 106. The microscope column 120 defines an optical axis 116 of the charged particle beam microscope system 104.

A sample 124 to be investigated can be disposed along the optical axis 116. The sample 124 can be supported by a sample holder 140, which in some examples can have capabilities to translate, rotate, and/or tilt the sample 124 relative to the optical axis 116. The sample holder 140 can allow different areas of the sample 124 to be positioned relative to the optical axis 116 for investigation.

At the top of the microscope column 120 is a charged particle source 108 (e.g., a thermal electron source, Schottky-emission source, field emission source, etc.) that emits a charged particle beam 112 (e.g., an electron beam). The charged particle beam 112 is directed along the optical axis 116 such that it can impinge on the sample 124 and interact with the sample 124. The charged particle beam 112 passes through the sample 124 to produce an image.

A camera 136 at the bottom of the microscope column 120 can be operated to capture an image of the sample 124. The camera 136 can include, for example, a CCD (charged-coupled device) imaging sensor, a CMOS (complementary metal-oxide-semiconductor) imaging sensor, or, more generally, an array of photodetectors. In one example, the camera 136 can be operable in a "movie" mode to capture a sequence of images of the sample.

The microscope column 120 can include various charged particle beam lens systems (hereafter, lens systems) that direct the charged particle beam 112 along the optical axis 116 and configure the charged particle beam 112 to provide a constant illumination covering a desired field of view on the sample 124. In some examples, the various lens systems can also project the image produced by interaction of the charged particle beam 112 with the sample 124 into a field of view of the camera 136.

In some examples, the various lens systems can include a condenser lens system 122, an objective lens system 126, and a projector lens system 130, which can have any suitable configuration to modify the charged particle beam 112 to provide a desired field of view. The condenser lens system 122 can be configured to condense the charged particle beam 112 into a nearly parallel beam. The objective lens system 126 can be configured to focus the image formed by transmitting the charged particle beam 112 through the sample 124. The projector lens system 130 can be configured to project the image coming from the objective lens system 126 to the field of view of the camera 136.

In some examples, the condenser lens system 122 can include condenser lenses 122a, 122b and other components, such as a condenser stigmator 122c (i.e., a device to correct axial astigmatism), and a condenser aperture 122d.

In some examples, the objective lens system 126 can include an objective lens 126a and other components, such as beam deflectors 126b (which can be used to center the beam), an objective stigmator 126c (i.e., a device to correct axial astigmatism), and objective aperture 126d. In the illustrated example, the sample 124 is positioned above the objective lens 126a (in other examples, the sample 124 can be inserted into the objective lens 126a).

In some examples, the projector lens system 130 can include, for example, an intermediate lens 130a (e.g., to magnify the image) and projector lenses 130b, 130c. The projector lens system 130 can include other components, such as a stigmator, image deflector, and aperture.

The components of the lens systems can be electro-optical components that are tunable by varying the electrical current applied to the components. For example, the various lenses of the lens systems 122, 126, 130 can be electromagnetic lenses. An electromagnetic lens modifies charged particle beams by a magnetic field generated by a solenoid. By changing the electric current to the solenoid, the magnetic field can be changed, which would correspondingly change the focal length and magnification of the lens. The other components of the lens systems 122, 126, 130, such as the stigmators and beam deflectors, can be electromagnetic devices, which can be tuned in the same manner as described for the electromagnetic lenses. The ability to tune the components of the lens systems 122, 126, 130 by varying electrical current supplied to the components can allow aberration corrections to be applied to the microscope column 120 on the fly (e.g., while the charged particle beam microscope system 104 is operating in a transmission imaging mode).

The lens systems 122, 126, 130 can include other optical components not shown in FIG. 1 or a different configuration of optical components. The microscope column 120 can include other optical components near the output of the charged particle source 108. For example, the microscope column 120 can include an accelerator stack that can be used to increase the acceleration of the charged particle beam 112 (e.g., prior to condensing the charged particle beam 112).

The system 100 includes a pattern generator 144 that can generate various patterns. The pattern generator 144 can be, for example, a programmable function generator. In some examples, the pattern generator 144 can be configured to generate periodic patterns. In one example, the periodic pattern can be a Lissajous figure. Lissajous figure is given by the following parametric equations:

$$x = A \sin(at + \delta) \quad (1)$$

$$y = B \sin(bt) \quad (2)$$

The Lissajous figure can be as simple as a circle (e.g., the parametric equations (1) and (2) give a circle when a/b=1, A=B, and δ=π/2 radians) or can be more complex (e.g., the ratio a/b is not equal to 1).

The system 100 includes beam deflectors 134 inserted in the microscope column 120. The beam deflectors 134 can be controlled according to the pattern to tilt the charged particle beam 112 in the X and Y directions over time. The beam deflectors 134 can apply tilt motion to the charged particle beam 112 prior to the charged particle beam 112 reaching the sample 124 (e.g., prior to condensing the charged particle beam 112). The beam deflectors 134 can be electro-optic deflectors (e.g., electrostatic or magnetic beam deflectors), which would allow the tilt angles applied to the charged particle beam 112 to be changed by varying the electrical current to the beam deflectors.

The beam deflectors 134, operated according to a pattern, apply a time series of beam tilts to the charged particle beam 112. Each beam tilt produces an image. Thus, the time series of beam tilts results in a sequence of images. Image shifts between successive (or adjacent) images in the sequence of images can indicate optical aberrations in the microscope system.

The system 100 can include a frame grabber 148 in communication with the camera 136. The frame grabber 148 can, for example, form an interface between the camera 136 and a computing system 154 (e.g., a server). The frame grabber 148 is an electronic device that can capture individual image frames from a stream of image data produced by the camera 136.

The system 100 can include an image shift tracker 152 in communication with the frame grabber 148. The image shift tracker 152 can receive image frames from the frame grabber 148 and measure (or compute) the image shift between successive image frames over time. The image shift tracker 152 can use any suitable imaging processing technique to measure images shift. One example technique is cross-correlation. In one example, the image shift tracker 152 can be executed by a processor (e.g., GPU, CPU, or FPGA) of the computing device 154.

The system 100 can include an aberration calculator 156 that determines values for the optical aberrations in a charged particle beam microscope system based on the image shifts measured by the image shift tracker 152. Examples of optical aberrations that can be found in charged particle beam microscopes and measured are defocus, two-fold astigmatism, three-fold astigmatism, four-fold astigmatism, five-fold astigmatism, sixfold astigmatism, axial coma, fifth order axial coma, spherical aberration, sixth order spherical aberration, star aberration, sixth order star aberration, three-lobe aberration, and rosette aberration. The aberration calculator 156 can be configured to determine values for any combination of these optical aberrations as well as other optical aberrations not specifically mentioned.

In one example, the aberration calculator 156 can receive a stream of image shifts from the image shift tracker 152 and compute the optical aberrations in the microscope column 120 based on the image shifts. In one example, the aberration calculator 156 can estimate the optical aberrations by fitting the image shifts to an optical aberration model that provides a relationship between image shifts, beam tilts, and optical aberrations in the microscope column 120. In some examples, the optical aberration model can be extended with one or more auxiliary parameters that are also fitted. The auxiliary parameters can capture variances in the measurements. For example, the time duration between generating a tilt position and actually tilting the beam with the tilt position can vary such that there is an unknown time delay between the beam tilt applied and the sequence of images captured from applying the beam tilt. In some examples, beam tilting control timing can be uncoupled or not synchronized with imaging sensors. In such cases, one such auxiliary parameter can be an unknown time delay or time synchronization between the pattern that controls the beam tilt and the images captured by the camera 136. Another example of auxiliary parameters can include sample drift. With periodic tilt patterns, a phase of the periodic tilt pattern can be related to a phase of the detected pattern to provide timing information. In some examples, a portion of a tilt pattern period, between one and two periods, or more than two periods may be sufficient to provide time used to synchronize clock timing between beam controls and image detection. Various tilt patterns can be used, including non-periodic movements.

In another example, the aberration calculator 156 can determine values for the optical aberrations based on optimization of a model that provides a relationship between a sequence of images and optical aberrations in the microscope column 120. For example, an image acquired at one tilt angle can be transformed to an image acquired at another tilt angle. The transformation could be parameterized by variables related to optical aberrations. These parameters would then correspond to the model. In an optimization routine, the optical parameters that can maximize the similarity of the transformed images can be found and used to determine values for the optical aberrations. This procedure can be extended to multiple images.

In another example, the aberration calculator 156 can determine values for the optical aberrations from an inference of a neural network that has been trained to predict optical aberrations from image information obtained by applying a series of beam tilts to a charged particle beam in a pattern. The trained neural network can receive the sequence of images as input and/or can receive information derived from the sequence of images (e.g., power spectra of the images, image shifts, etc.) as input and generate an inference, which can include a prediction and other information such as confidence of the prediction. In this example, the aberration calculator 156 can receive the image data directly from the camera 136 or receive image frames from the frame grabber 148, preprocess the image data, and provide the preprocessed image data to the neural network. In some cases, the inference can be a service that is provided via a cloud.

The system 100 can include an aberration corrector 168 that is communicatively coupled to the aberration calculator 156. The aberration corrector 168 can determine corrections to apply to the components of the microscope column 120 (e.g., the components of the lens systems) based on the optical aberrations determined by the aberration calculator 156. For example, where the components are electro-optical components, the aberration corrector 168 can change the electrical current applied to the components in order to change how the components modify the charged particle beam 112. In some examples, the aberration corrector 168 can apply the corrections to the components of the microscope column 120 based on predetermined criteria (e.g., if the optical aberrations exceed predetermined thresholds or if the confidence of an estimated aberration value exceeds a predetermined threshold (e.g., if the absolute value of an estimated aberration value is less than a confidence interval for that optical aberration)).

In some examples, the aberration corrector 168 can determine adjustments to make to the pattern generated by the pattern generator 144 for beam tilting. For example, the aberration calculator 156 can provide the optical aberrations with a level of confidence. If the level of confidence is low, the aberration corrector 168 can determine an optimal pattern to use in subsequent beam tilting in order to improve the confidence of the measurements. The aberration corrector 168 can further determine the parameters of the optimal pattern (such as base frequency and amplitude) and provide this information to the pattern generator 144.

In some examples, the aberration calculator 156 and aberration corrector 168 can be programs or scripts running on a computing system 160 that is communicatively coupled to the charged particle beam microscope system 104. The aberration corrector 168 can be in communication with the aberration calculator 156 and the pattern generator 144. In some examples, the computing system 160 can be coupled to a display 164 (e.g., a console of the charged particle beam microscope system 104). In some examples, the computing system 160 can present current aberration values and trends in the aberrations on the display 164.

The image shift tracker 152, aberration calculator 156, and aberration corrector 168 can be implemented in software and/or hardware. Software components of the image shift tracker 152, aberration calculator 156, and aberration corrector 168 can be stored in one or more computer-readable storage media or computer-readable storage devices and executed by one or more processors (e.g., processors in the computing system 160 or 154). Any of the computer-readable media herein can be non-transitory (e.g., volatile memory such as DRAM or SRAM, nonvolatile memory such as magnetic storage, optical storage or the like) and/or tangible.

Figure 2A:
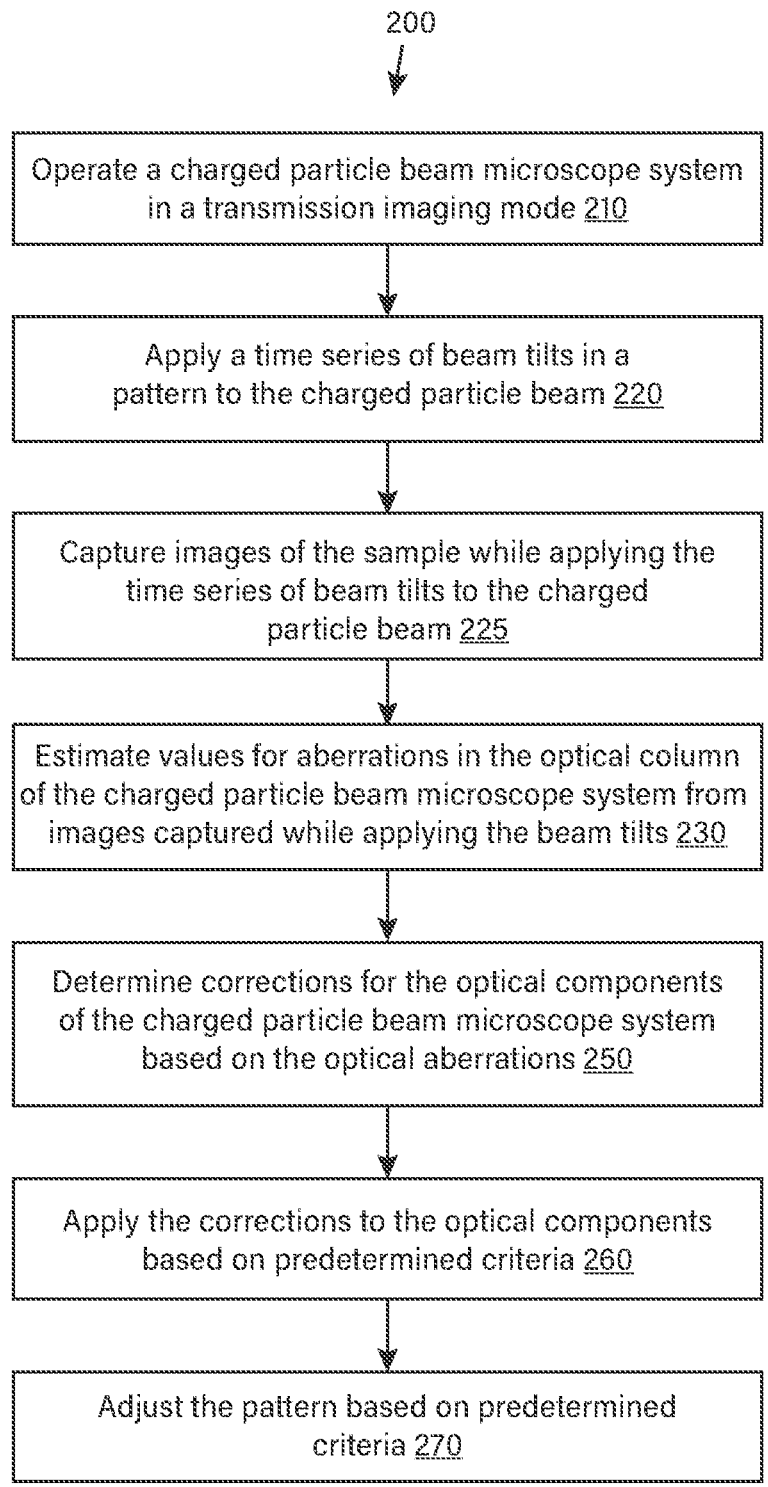
FIGS. 2A and 2B are flow diagrams of a method for measuring and correcting optical aberrations in a charged particle beam microscope system operating in a transmission imaging mode, in accordance with various implementations.

FIG. 2A is a flow diagram illustrating a method 200 of measuring and correcting optical aberrations in a charged particle beam microscope system (e.g., the charged particle beam microscope system 104 illustrated in FIG. 1) operating in a transmission imaging mode. Operations are illustrated once each and in a particular order in FIG. 2A (and in the others of the flow diagrams discussed therein), but the operations may be reordered and/or repeated as desired and appropriate (e.g., different operations performed may be performed in parallel, as suitable).

At 210, the method includes operating a charged particle beam microscope system in a transmission imaging mode. The operation 210 can include generating a charged particle beam (e.g., an electron beam) using a charged particle source at the top of the microscope column and directing the charged particle beam to a sample using optical components in the microscope column. The charged particle beam interacts with the sample to produce an image. The operation 210 can include projecting the image into a field of view of a camera at the bottom of the microscope column.

At 220, with the charged particle beam microscope system operating in the transmission imaging mode as described in operation 210, the method can include applying a time series of beam tilts in a pattern to the charged particle beam coming out of the charged particle source. The operation 220 can include generating the pattern. The operation 220 can include applying the time series of beam tilts by traversing the pattern. At each point on the traversal path, the x, y coordinates of the point determine the amount of tilt to apply to the charged particle beam in the X and Y directions. The tilt amounts can be used to control the beam deflectors inserted in microscope column to tilt the beam. In some examples, the pattern can be a periodic pattern. In some examples, the periodic pattern can be a Lissajous figure (or Lissajous curve).

At 225, while applying beam tilts to the charged particle beam as described in operation 220, the method can include operating a camera in a movie mode to capture images of the sample. For every beam tilt, the camera can obtain a full image of the sample. Thus, the camera can capture a sequence of images corresponding to applying the time series of beam tilts to the charged particle beam. The time between applying the beam tilt and the actual tilting of the beam can vary such that there is an unknown time delay between the beam tilting pattern and the sequence of images captured. In some examples, the optical aberration model can incorporate the unknown time delay as an auxiliary variable to be fitted. Other auxiliary variables can be incorporated in the optical aberration model as well, e.g., beam tilt pattern or sample drift.

At 230, the method can include estimating values for the optical aberrations in the microscope column from the images captured in operation 225. In one example, the optical aberrations can be estimated from an optical aberration model that relates image shifts to beam tilts and optical aberrations of the microscope column. In another example, the optical aberrations can be obtained by optimizing a model that provides a relationship between the sequence of images and optical aberrations in the microscope column. In another example, the optical aberrations can be obtained as an inference of a trained neural network. The inference can include the prediction of the neural network as well as other information such as confidence of the prediction.

Figure 2B:
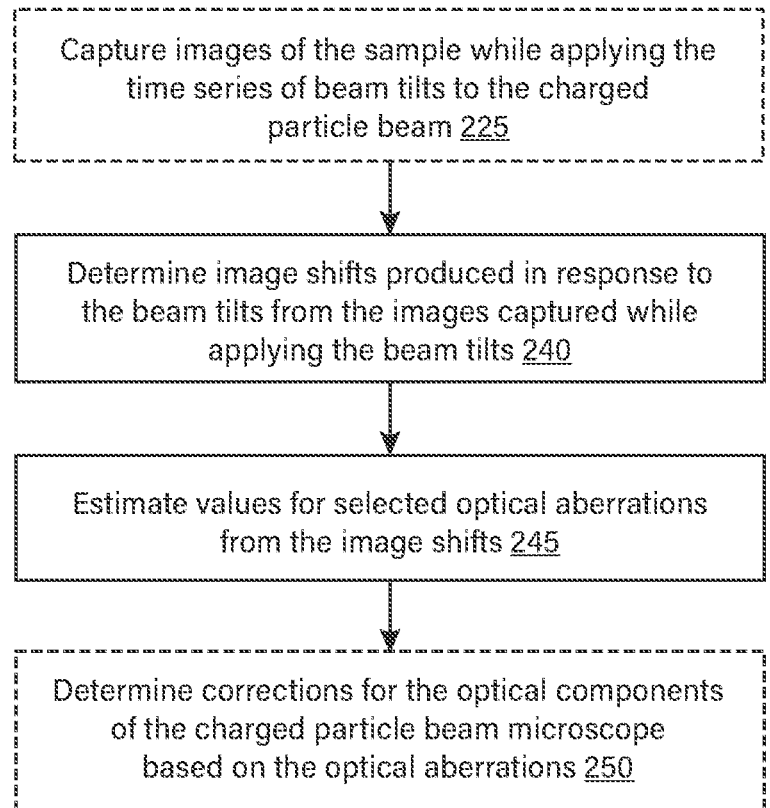

FIG. 2B illustrates one example of operation 230 of FIG. 2A. In the example illustrated in FIG. 2B, at 240, the method includes determining image shifts from a sequence of images captured in operation 225. The operation 240 can include receiving image data from the camera and extracting a sequence of images (or image frames) from the image data. Each image will correspond to an image of the sample at a given beam tilt. Any shift between successive (or adjacent) images will depend on the optical aberration of the charged particle beam microscope. The operation 240 includes determining these image shifts using any suitable image processing technique, such as cross-correlation.

Figure 3A:
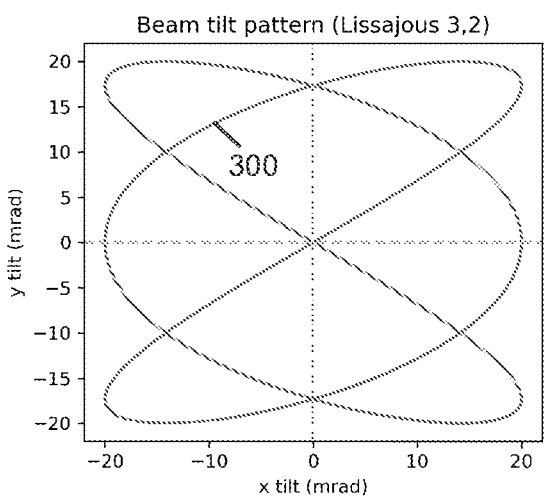
FIG. 3A is a graph of a Lissajous figure beam tilt pattern.

For illustrative purposes, FIG. 3A shows a beam tilt pattern 300 that can be applied to a charged particle beam, and FIGS. 3B-3E show expected image shift patterns 302, 304, 306, 308 produced from applying the beam tilt pattern 300 due to various types of microscope aberrations (e.g., defocus, astigmatism, coma, and spherical aberration). The beam tilt pattern 300 is a Lissajous pattern (with a=3, b=2, where a and b are indicated in Equations (1) and (2)). FIGS. 3B-3E show the movement of the image of the sample over time as the beam tilt pattern is applied. If there are no optical aberrations in the microscope, the beam tilt pattern will not induce a shift in the images of the sample collected over time. However, if there are aberrations in the microscope, the pattern formed by the movement of the sample will be different from the applied beam tilt pattern (e.g., scaled and/or distorted).

Figure 3B:
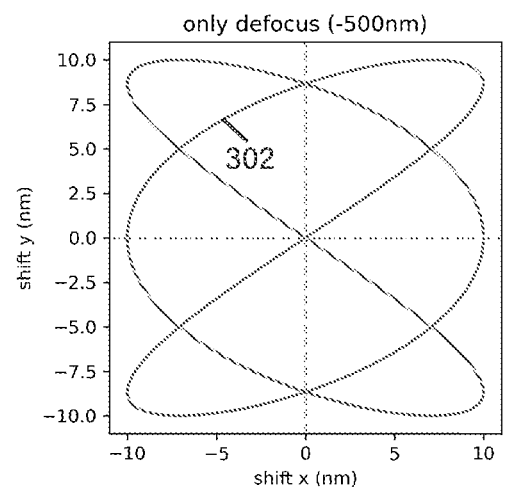
FIG. 3B is a graph of an expected induced image shift pattern produced by the Lissajous figure beam tilt pattern depicted in FIG. 3A when there is defocus in the charged particle beam microscope system.

The image shift pattern 302 shown in FIG. 3B corresponds to an example where the optical aberration in the microscope is defocus. The image shift pattern 302 and the applied beam tilt pattern 300 are linearly dependent (i.e., the image shift pattern 302 is scaled relative to the applied beam tilt pattern 300—the amount of defocus is the scaling factor between the figures shown in FIGS. 3A and 3B).

Figure 3C:
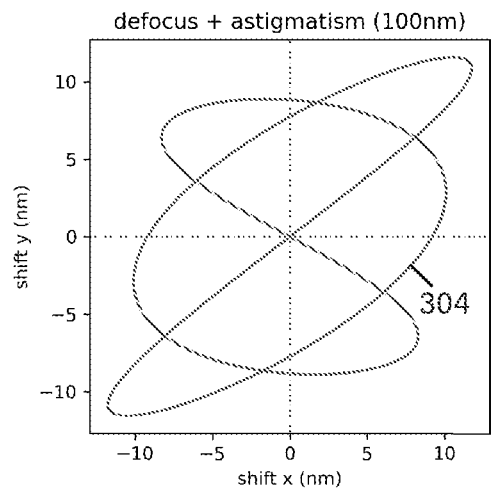
FIG. 3C is a graph of an expected induced image shift pattern produced by the Lissajous figure beam tilt pattern depicted in FIG. 3A when there is defocus and astigmatism in the charged particle beam microscope system.

The image shift pattern 304 shown in FIG. 3C corresponds to an example where the optical aberrations in the microscope are defocus and astigmatism. The image shift pattern 304 compared to the applied beam tilt pattern 300 is deformed in one direction (by astigmatism) and scaled (by defocus).

Figure 3D:
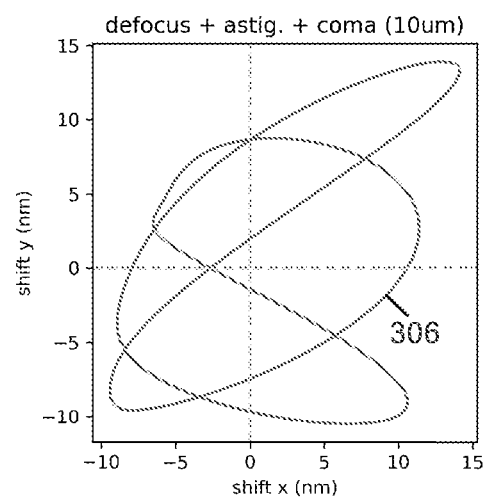
FIG. 3D is a graph of an expected induced image shift pattern produced by the Lissajous figure beam tilt pattern depicted in FIG. 3A when there is defocus, coma, and astigmatism in the charged particle beam microscope system.

The image shift pattern 306 in FIG. 3D corresponds to an example where the optical aberrations in the microscope are defocus, astigmatism, and coma. The image shift pattern 306 compared to the applied beam tilt pattern 300 is distorted asymmetrically (by coma), deformed in one direction (by astigmatism), and scaled (by defocus).

Figure 3E:
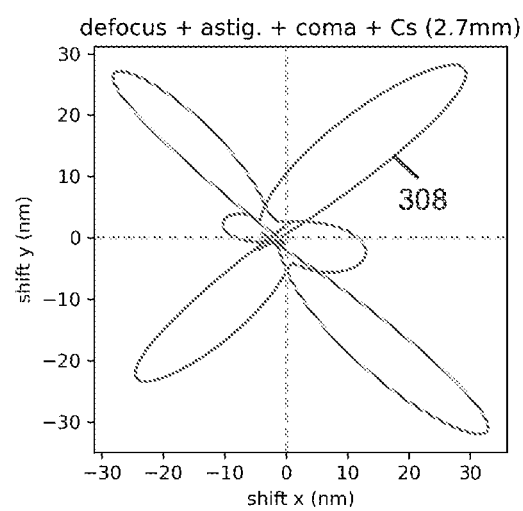
FIG. 3E is a graph of an expected induced image shift pattern produced by the Lissajous figure beam tilt pattern depicted in FIG. 3A when there is defocus, coma, astigmatism, and spherical aberration in the charged particle beam microscope system.

The image shift pattern 308 shown in FIG. 3E corresponds to an example where the optical aberrations in the microscope are defocus, astigmatism, coma, and spherical aberration. The image shift pattern 308 compared to the applied beam tilt pattern 300 is distorted radially (by spherical aberration), distorted asymmetrically (by coma), deformed in one direction (by astigmatism), and scaled (by defocus).

FIG. 4A illustrates another example of a beam tilt pattern 400 that can be applied to a charged particle beam, and FIGS. 4B-4D illustrate expected image shift patterns 402, 404, 406 produced from applying the beam tilt pattern 400 due to various types of microscope aberrations (e.g., defocus, astigmatism, and coma). The beam tilt pattern 400 is a circular pattern (which is a special case of a Lissajous figure). FIGS. 4B-4D show the movement of the image of the sample over time as the beam tilt pattern is applied. If there are no optical aberrations in the microscope, the beam tilt pattern will not induce a shift in the images of the sample collected over time. However, if there are aberrations in the microscope, the pattern formed by the movement of the sample will be different from the applied beam tilt pattern (e.g., scaled and/or distorted).

The image shift pattern 402 in FIG. 4B corresponds to an example where the optical aberration in the microscope is defocus (the image shift pattern 402 is scaled compared to the applied beam tilt pattern 400—the amount of defocus is the scaling factor between the figures shown in FIGS. 4A and 4B). The image shift pattern 404 in FIG. 4C corresponds to an example where the optical aberrations in the microscope are defocus and astigmatism (the image shift pattern 404 is scaled and deformed in one direction). The image shift pattern 406 in FIG. 4D corresponds to an example where the optical aberrations in the microscope are defocus, astigmatism, and coma (the image shift pattern 406 is scaled, deformed in one direction, and distorted asymmetrically).

A circular pattern, such as the beam tilt pattern 400 shown in FIG. 4A, can capture low order aberrations (e.g., defocus) effectively but may be less sensitive to higher order aberrations. For higher order aberrations, a more complex Lissajous figure, such as the beam tilt pattern 300 shown in FIG. 3A, may be more suitable.

Returning to FIG. 2B, at 245, the method includes estimating values for selected optical aberrations from the image shifts obtained in operation 240. The aberration values can be estimated by fitting the image shifts to an optical aberration model for the charged particle beam microscope system.

Equation (3) below is an example of an optical aberration model. For illustrative purposes, the model of Equation (3) can obtain values for defocus, astigmatism (astigX, astigY), coma (comaX, comaY), threefold astigmatism (threefoldX, threefoldY), spherical aberration (spherical), star aberration (starX, starY), and fourfold astigmatism (fourfoldX, fourfoldY).

$$\begin{pmatrix} shiftX \\ shiftY \end{pmatrix} = \left\{ \begin{vmatrix} tx \\ ty \end{vmatrix} \begin{vmatrix} tx \\ -ty \end{vmatrix} \begin{vmatrix} ty \\ tx \end{vmatrix} \begin{vmatrix} tx^2 + \frac{ty^2}{y} \\ \frac{2txty}{3} \end{vmatrix} \begin{vmatrix} \frac{2txty}{3} \\ \frac{tx^3}{3} + ty^2 \end{vmatrix} \begin{vmatrix} tx^2 - ty^2 \\ -2txty \end{vmatrix} \begin{vmatrix} 2txty \\ tx^2 - ty^2 \end{vmatrix} \cdots \right. \\ \left. \begin{vmatrix} tx(tx^2 + ty^2) \\ ty(tx^2 + tx^2) \end{vmatrix} \begin{vmatrix} tx^3 \\ -ty^3 \end{vmatrix} \begin{vmatrix} \frac{1}{2}(3tx^2ty + ty^2) \\ \frac{1}{2}(tx^2 + 3txty^2) \end{vmatrix} \begin{vmatrix} tx^3 - 3txty^2 \\ -3tx^2ty + ty^3 \end{vmatrix} \begin{vmatrix} 3tx^2ty - ty^3 \\ tx^3 - 3txty^2 \end{vmatrix} \right\} \cdot \begin{pmatrix} defocus \\ astigX \\ astigY \\ comaX \\ comaY \\ threefoldX \\ threefoldY \\ spherical \\ starX \\ starY \\ fourfoldX \\ fourfoldY \end{pmatrix} \quad (3)$$

The vector on the right hand side of the equation contains values for optical aberrations for a given state of the optical system of the microscope system at a certain moment in time. When the tilt of the beam is adjusted with (tx, ty) radians, then the induced image shift will be given by (shiftX, shiftY), which can be measured from images captured while applying the beam tilts (e.g., in operation 240). The measured shiftX, shiftY and known tx, ty can be fitted into the model of Equation (3) to obtain the estimated values for the optical aberrations. The parameters tx, ty are time-dependent, which allows unknown time delay between the applied beam tilt pattern and the induced image shift pattern to be factored into the model for fitting. Variations of the optical aberration model can incorporate other auxiliary parameters, such as beam tilt pattern and/or sample drift.

Returning to FIG. 2A, at 250, the method includes determining corrections to apply to the optical components in the microscope column based on the aberration values estimated in operation 230 (or in operation 245 in FIG. 2B).

At 260, the method can include applying the corrections determined in operation 250 to one or more of the optical components in the microscope column based on predetermined criteria. For example, if the estimated values for one or more of the selected aberrations are above predetermined thresholds, the corrections could be applied. Alternatively, if the estimated values for the selected aberrations are below predetermined thresholds, the corrections may not be applied. However, the corrections can be stored and used during post processing of the captured images of the sample.

At 270, the method can include adjusting the pattern used in beam tilting in operation 220 based on predetermined factors. For example, the pattern can be adjusted, for example, if an accuracy of the estimated values for one or more selected optical aberrations is below a predetermined threshold, a quality of the images in the sequence of images is below a predetermined threshold, and/or there are external disturbances (e.g., mechanical vibrations) while capturing the sequence of images. The pattern can be adjusted by changing the parameters of the pattern (e.g., the base frequency and/or amplitude of the pattern can be changed) or by selecting a new pattern that is optimal for the configuration of the microscope and sample.

The operations 220-270 can be repeated until the end of a planned acquisition or until the aberrations are measured with a desired accuracy or until aberrations are tuned to the desired values with desired accuracy. The aberration measurements over time can be displayed on a screen and monitored.

Figure 5A:
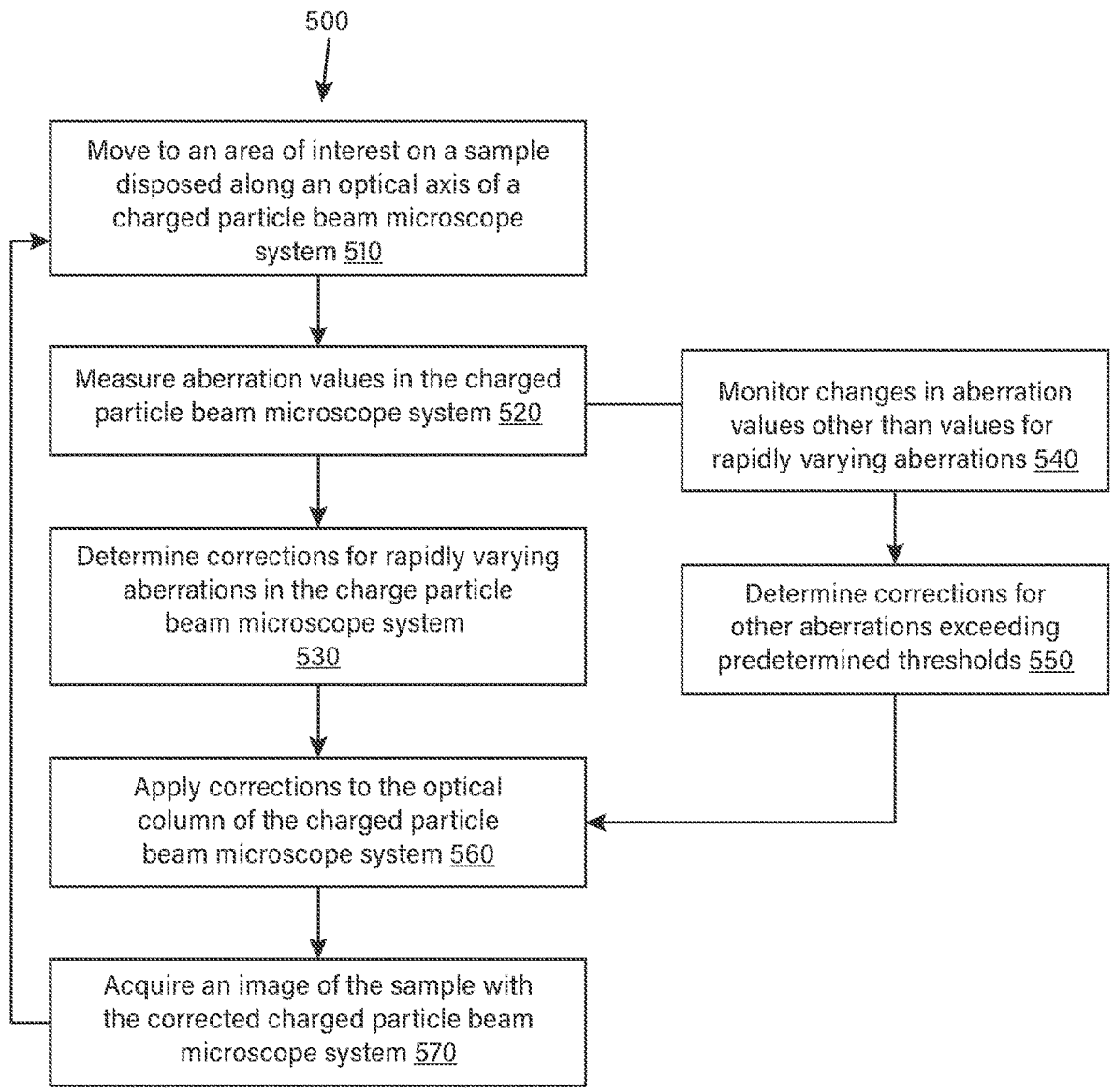
FIG. 5A is a flow diagram of an example method of operating a charged particle beam microscope system with monitoring and correction of aberrations.

FIG. 5A illustrates an example method 500 of operating a charged particle beam microscope system with monitoring and correction of aberrations (e.g., the system 100 illustrated in FIG. 1). The method 500 is optimized to accurately and precisely measure rapidly varying aberrations. As noted above for FIG. 2A and the others of the accompanying flow diagrams, operations are illustrated once each and in a particular order in FIG. 5A, but the operations may be reordered and/or repeated as desired and appropriate (e.g., different operations performed may be performed in parallel, as suitable). For example, the method 500 may include performing any suitable combinations of the operations presented therein in parallel.

At 510, with a sample disposed along the optical axis of the charged particle beam microscope system, the method 500 includes moving to an area of interest on the sample.

At 520, the method 500 includes measuring values of aberrations in the charged particle beam microscope system. In one example, the measurements can be made according to operations 210-230 in FIG. 2A.

At 530, the method 500 includes determining corrections for rapidly varying aberrations (e.g., defocus) in the charged particle beam microscope system.

At 540, the method 500 includes monitoring changes in values for other optical aberrations (e.g., optical aberrations that are not rapidly varying, such as two-fold astigmatism, three-fold astigmatism, four-fold astigmatism, five-fold astigmatism, sixfold astigmatism, axial coma, fifth order axial coma, spherical aberration, sixth order spherical aberration, star aberration, sixth order star aberration, three-lobe aberration, or rosette aberration). The changes in the optical aberrations can be presented in a display, for example, in the form of trend graphs.

At 550, the method 500 can include determining corrections for other aberrations having values exceeding predetermined thresholds.

At 560, the method 500 includes applying any corrections determined in operations 530 and 540 to the optical column of the charged particle beam microscope system (or microscope column).

At 570, the method 500 includes acquiring an image of the sample with the corrected charged particle beam microscope system. After acquiring the image, the method 500 can return to operation 510 to process another area of the sample.

Some optical aberrations (e.g., defocus) can be identified using a relatively small amount of data while other optical aberrations (e.g., coma and astigmatism) can require a relatively large amount of data to be appropriately identified. Instead of waiting to identify all the optical aberrations before determining and applying optical corrections to the charged particle beam microscope system, the optical corrections can be determined and applied more quickly for the optical aberrations that can be identified using a relatively small amount of data.

Figure 5B:
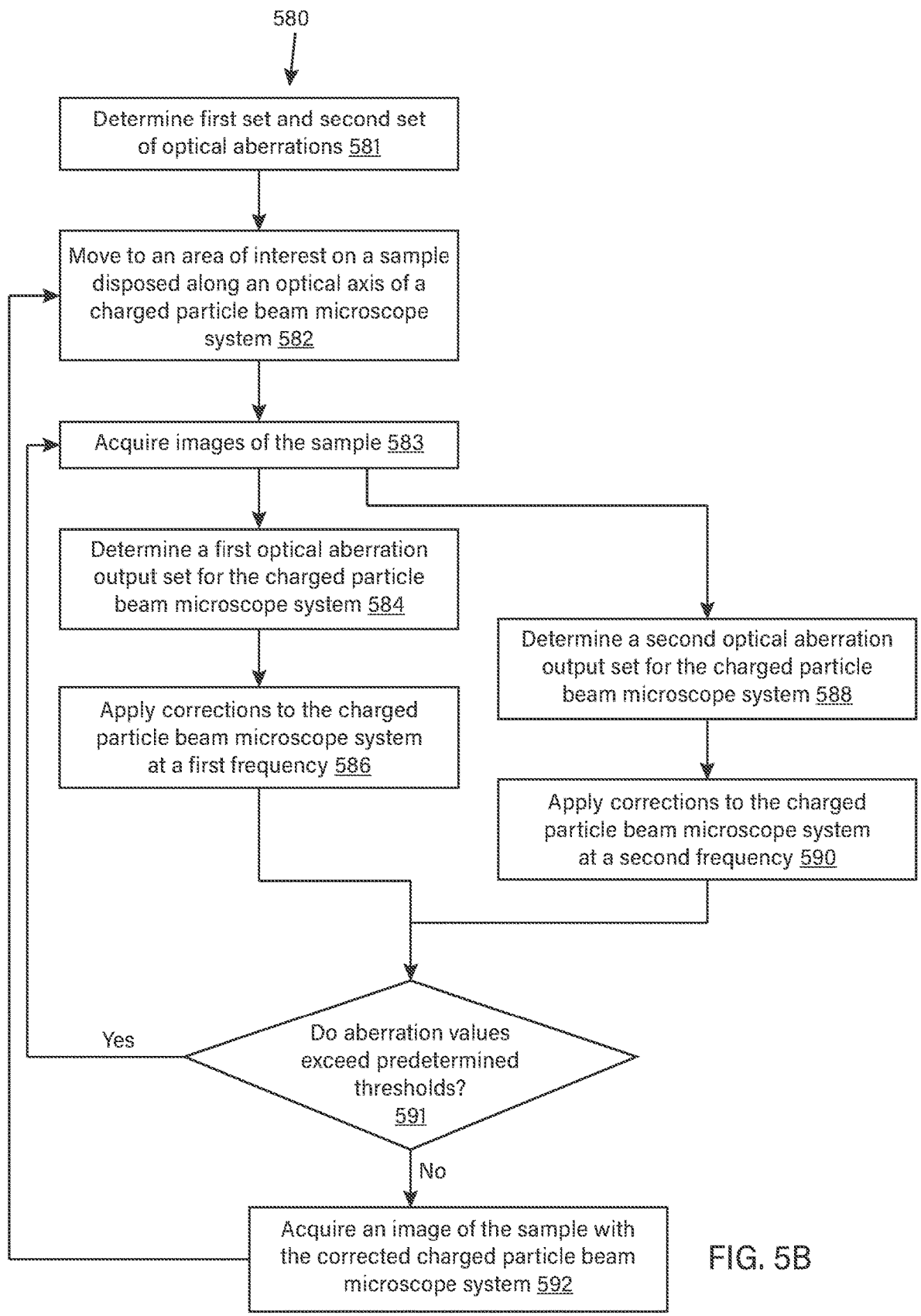
FIG. 5B is a flow diagram of another example method of operating a charged particle beam microscope system with monitoring and correction of aberrations.

FIG. 5B illustrates an example method 580 of operating a charged particle beam microscope system with monitoring and correction of aberrations (e.g., the system 100 illustrated in FIG. 1) based on the principle of applying optical corrections at different frequencies. As noted above for FIG. 2A and the others of the accompanying flow diagrams, operations are illustrated once each and in a particular order in FIG. 5B, but the operations may be reordered and/or repeated as desired and appropriate (e.g., different operations performed may be performed in parallel, as suitable). For example, the method 580 may include performing any suitable combinations of the operations presented therein in parallel.

At 581, a first set of one or more optical aberrations and a second set of one or more optical aberrations are determined. The first set of one or more optical aberrations is different from the second set of one or more optical aberrations (e.g., the one or more optical aberrations in the first set are different than the one or more optical aberrations in the second set). In one example, the differences between the first and second sets can be based on the amount of data required to appropriately identify the optical aberrations and/or on the drift rate (i.e., the speed at which the optical aberration significantly changes its value) in the microscope system. In one example, the first set can include one or more optical aberrations that can be identified using a relatively small amount of data (e.g., defocus). In one example, the second set can include one or more optical aberrations that require a relatively large amount of data to be appropriately identified (e.g., coma and astigmatism).

At 582, the method 580 includes moving to an area of interest on a sample disposed along an optical axis of the charged particle beam microscope system.

At 583, the method 580 includes acquiring images of the sample while operating the charged particle beam microscope system. The images can be acquired, for example, as described in operations 210-225 in FIG. 2A.

At 584, the method 580 includes determining a first optical aberration output set for the charged particle beam microscope system. The first optical aberration output set includes values for the first set of one or more optical aberrations in the charged particle beam microscope system.

A first input set for determining the first optical aberration output set includes one or more of the images acquired in operation 583. The values for the first set of one or more optical aberrations can be determined, for example, using the aberration calculator (156 in FIG. 1) and the first input set. In some examples, the first optical aberration output set can further include values for one or more of the second set of one or more optical aberrations in the charged particle beam microscope system. The values for the second set can be determined, for example, using the aberration calculator and the first input set. The values for the first set and second set can be determined within the same aberration calculation (e.g., using the same optical aberration model, optimization of a model, or trained neural network). The values in the first optical aberration output set can include estimated values of the optical aberrations and confidence of the estimation.

At 586, the method 580 includes applying corrections (or adjustments) to the charged particle beam microscope system at a first frequency to mitigate the first set of one or more optical aberrations. The corrections to apply to the first set of one or more optical aberrations are determined based on the values corresponding to the first set of one or more optical aberrations in the first optical aberration output set determined in operation 584. In one example, the corrections can be applied by varying electrical currents supplied to one or more electro-optical components of the charged particle beam microscope system.

At 588, the method 580 includes determining a second optical aberration output set for the charged particle beam microscope system. The second optical aberration output set includes values for the second set of one or more optical aberrations in the charged particle microscope system. A second input set for determining the second optical aberration output set can include one or more of the images acquired in operation 583 or can include some values from the first optical aberration output set (e.g., the values determined for one or more of the second set of one or more optical aberrations in operation 584). In one example, the values for the second set of one or more optical aberrations can be determined using the aberration calculator (156 in FIG. 1) and the second input set. In some examples, the values determined for one or more of the second set of one or more optical aberrations in operation 584 can be accumulated over time and used to determine the values for the second optical aberration output set (e.g., the values determined for an optical aberration in the second set in operation 584 over time can be averaged to determine the corresponding value for the optical aberration in the second optical aberration output set). The operation 588 may run at a slower rate compared to the operation 584. Thus, one or more executions of determining the first optical aberration output set can be completed before a single execution of determining the second optical aberration output set is completed (allowing for the aforementioned accumulation of data from operation 584 to determine values for the second optical aberration output set).

At 590, the method 580 includes applying corrections (or adjustments) to the charged particle beam microscope system at a second frequency to mitigate the second set of one or more optical aberrations whose values were determined in operation 588. In one example, the second frequency in operation 590 is different from the first frequency in operation 586. For example, the second frequency is less than the first frequency so that the corrections in operation 586 are applied more frequently than the corrections in operation 590. The second frequency can be selected based on the time required for each iteration of operation 588 to determine the second optical aberration set sufficiently accurately. In one example, the corrections can be applied by varying electrical currents supplied to one or more electro-optical components of the charged particle beam microscope system.

At 591, the method 580 can include determining if the values determined in any of operations 584 and 588 exceed predetermined thresholds. If the values exceed predetermined thresholds, the method can return to operation 583 to acquire more images of the sample with the corrections applied to the charged particle beam microscope system.

At 592, the method 580 can include acquiring an image of the sample with the corrected charged particle beam microscope system. In some cases, the image can be acquired when it is determined that the aberration values determined in operations 584 and 588 do not exceed predetermined thresholds. After acquiring the image, the method 580 can return to operation 582 to process another area of the sample or the same area of the sample. In other examples, operation 582 can be performed in parallel to other operations in the method 580 (i.e., determining aberration values and making corrections to the microscope system can be performed while moving the sample relative to the microscope system).

Figure 6:
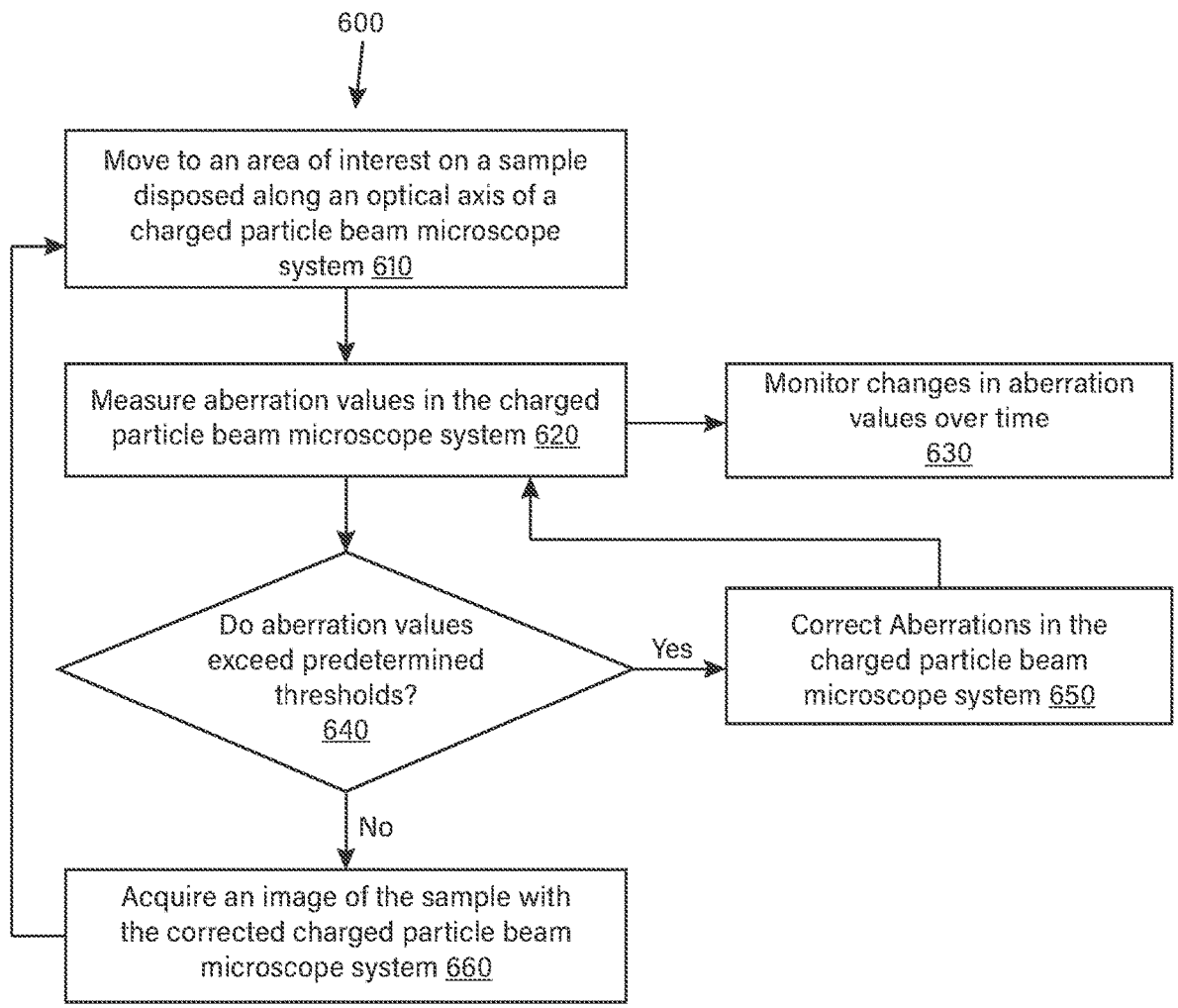
FIG. 6 is a flow diagram of another example method of operating a charged particle beam microscope system with monitoring and correction of aberrations.

FIG. 6 illustrates an example method 600 for acquiring an image of a sample with a charged particle beam microscope system with monitoring and correction of aberrations. As noted above for FIG. 2A and the others of the accompanying flow diagrams, operations are illustrated once each and in a particular order in FIG. 6, but the operations may be reordered and/or repeated as desired and appropriate (e.g., different operations performed may be performed in parallel, as suitable). For example, the method 600 may include performing any suitable combinations of the operations presented therein in parallel.

At 610, with the sample disposed along the optical axis of the charged particle beam microscope system, the method 600 includes moving to an area of interest on the sample.

At 620, the method 600 includes measuring values of aberrations in the charged particle beam microscope system according to operations 210-230 in FIG. 2A.

At 630, the method 600 includes monitoring changes in the optical aberrations over time. The changes in the optical aberrations can be presented in a display, for example, in the form of trend graphs. In an alternative implementation of the method, monitoring of the changes in the optical aberrations could be omitted.

At 640, the method 600 includes determining if any of the aberration values exceed a predetermined threshold. If any of the aberration values exceed a predetermined threshold, the method 600 continues at operation 650. Otherwise, the method 600 continues at operation 660.

At 650, the method 600 includes determining corrections for the aberrations exceeding predetermined thresholds and applying the corrections to the optical column of the charged particle beam microscope system. After applying the corrections, the method 600 returns to operation 620 to repeat measurement of the aberration values. This can continue until there are no aberration values that exceed predetermined thresholds.

At 660, the method 600 includes acquiring an image of the sample with the corrected charged particle beam microscope system. After acquiring the image, the method 600 can return to operation 610 to process another area of the sample.

The operations in example methods 500, 580, 600 can be controlled by a computer program, which can be stored on one or more computer-readable storage media and executed by one or more processors of a computing system. The computer-readable storage media can be non-transitory (e.g., volatile memory such as DRAM or SRAM, nonvolatile memory such as magnetic storage, optical storage, or the like) and/or tangible.

Figure 7:
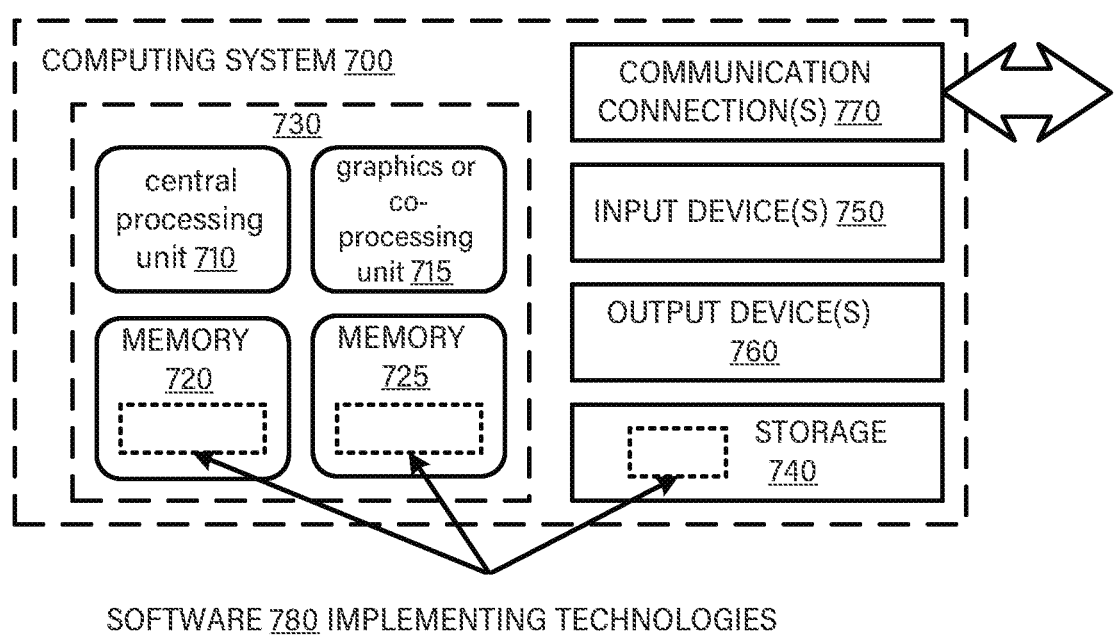
FIG. 7 is a block diagram of a generalized computing system of a suitable computing environment that may be used in methods implementing monitoring and correction of optical aberrations in a charged particle beam microscope system.

FIG. 7 is a block diagram of a generalized example computing system (or computing environment) that may be used in the methods described herein. In some examples, the methods can use a single computing system. In other examples, the methods can use multiple computing systems, which may communicate over a network.

With reference to FIG. 7, the computing system 700 includes one or more processing units 710, 715 and memory 720, 725. In FIG. 7, this basic configuration 730 is included within a dashed line. The processing units 710, 715 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 7 shows a central processing unit 710 as well as a graphics processing unit or co-processing unit 715. The tangible memory 720, 725 may be volatile memory (e.g., registers, cache, RAM), non-volatile memory (e.g., ROM, EEPROM, flash memory, etc.), or some combination of the two, accessible by the processing unit(s). The memory 720, 725 stores software 780 implementing one or more innovations described herein, in the form of computer-executable instructions suitable for execution by the processing unit(s). Software 780 can include, for example, one or more of the image shift tracker 152, the aberration calculator 156, the aberration corrector 168, or the logic of the methods 500, 580, 600.

A computing system may have additional features. For example, the computing system 700 can include storage 740, one or more input devices 750, one or more output devices 760, and one or more communication connections 770. An interconnection mechanism (not shown) such as a bus, controller, or network interconnects the components of the computing system 700. Typically, operating system software (not shown) provides an operating environment for other software executing in the computing system 700, and coordinates activities of the components of the computing system 700.

The tangible storage 740 may be removable or non-removable, and includes magnetic disks, magnetic tapes or cassettes, CD-ROMs, DVDs, or any other medium which can be used to store information in a non-transitory way and which can be accessed within the computing system 700. The storage 740 stores instructions for the software 780 implementing one or more innovations described herein.

The input device(s) 750 may be a touch input device such as a keyboard, mouse, pen, or trackball, a voice input device, a scanning device, or another device that provides input to the computing system 700. The output device(s) 760 may be a display, printer, speaker, CD-writer, or another device that provides output from the computing system 700.

The communication connection(s) 770 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

In view of the above described implementations of the disclosed subject matter, this application discloses the additional examples enumerated below. It should be noted that one feature of an example in isolation or more than one feature of the example taken in combination and, optionally, in combination with one or more features of one or more further examples are further examples also falling within the disclosure of this application.

Example 1 is a method including, with a charged particle beam microscope system operating in a transmission imaging mode, directing a charged particle beam to a sample including applying a time series of beam tilts in a pattern to the charged particle beam to produce a sequence of images, wherein at least some of the images in the sequence of images are captured while the charged particle beam is transitioning between one beam tilt in the time series of beam tilts and a sequentially adjacent beam tilt in the time series of beam tilts, and wherein the pattern is configured to induce image changes between the images in the sequence of images that are indicative of optical aberrations in the charged particle beam microscope system. The method includes capturing the sequence of images.

Example 2 includes the subject matter of Example 1 and further specifies that the pattern is a periodic pattern.

Example 3 includes the subject matter of Example 2 and further specifies that the periodic pattern is a Lissajous figure.

Example 4 includes the subject matter of any of Examples 1-3 and further includes generating a set of one or more optical aberration values for the charged particle beam microscope system from the sequence of images.

Example 5 includes the subject matter of Example 4, wherein the image changes comprise induced image shifts, and wherein generating the set of one or more optical aberration values for the charged particle beam microscope system from the sequence of images comprises measuring the induced image shifts between successive images in the sequence of images.

Example 6 includes the subject matter of Example 5, wherein generating the set of one or more optical aberration values for the charged particle beam microscope system from the sequence of the images further includes obtaining an inference from a neural network model trained to identify a set of optical aberrations from input data derived from the sequence of images.

Example 7 includes the subject matter of Example 5, wherein generating the set of one or more optical aberration values for the charged particle beam microscope system from the sequence of the images further includes fitting the induced image shifts to an optical aberration model describing a relationship between the induced image shifts, the beam tilts, and the set of optical aberrations.

Example 8 includes the subject matter of Example 7 and further specifies that the optical aberration model incorporates an unknown time delay between the pattern and the sequence of images.

Example 9 includes the subject matter of any of Examples 4-8, wherein generating the set of one or more optical aberration values for the charged particle beam microscope system from the sequence of images comprises estimating a value for one or more of defocus, two-fold astigmatism, three-fold astigmatism, four-fold astigmatism, five-fold astigmatism, sixfold astigmatism, axial coma, fifth order axial coma, spherical aberration, sixth order spherical aberration, star aberration, sixth order star aberration, three-lobe aberration, and rosette aberration.

Example 10 includes the subject matter of any one of Examples 4-9 and further includes determining optical corrections for the charged particle beam microscope system based on the set of one or more optical aberration values.

Example 11 includes the subject matter of Example 10 and further includes applying the optical corrections for the charged particle beam microscope system to one or more optical components of the charged particle beam microscope system.

Example 12 includes the subject matter of Example 10 and further includes adjusting the pattern based on one or more of accuracy of the set of one or more optical aberration values, quality of the images in the sequence of images, and external disturbances while capturing the sequence of images.

Example 13 includes the subject matter of any one of Examples 4-12 and further includes monitoring changes in the set of one or more optical aberrations over time.

Example 14 is a method including receiving, by one or more processors, a sequence of images captured while applying a time series of beam tilts in a periodic pattern to a charged particle beam transmitted along an optical axis of an optical column of a charged particle beam microscope system and through a sample disposed along the optical axis. The method includes estimating, by the one or more processors, values for one or more optical aberrations produced by the optical column from the sequence of images.

Example 15 includes the subject matter of Example 14 and further includes determining one or more optical corrections for one or more optical components in the optical column; and selectively applying the one or more optical corrections to the one or more optical components.

Example 16 includes the subject matter of any one of Examples 14-15 and further specifies that the periodic pattern is a Lissajous pattern.

Example 17 is a system including a charged particle source that emits a charged particle beam; an optical column defining an optical axis and comprising one or more optical components configured to form the charged particle beam into a field of view of a sample disposed along the optical axis; a pattern generator configured to generate a pattern; one or more beam deflectors disposed along the optical axis and controllable by the pattern to apply a time series of beam tilts to the charged particle beam; an imaging sensor positioned along the optical axis to capture images of the sample; one or more processors; and one or more computer-readable storage media storing instructions that when executed by the one or more processors cause the one or more processors to receive a sequence of images captured by the imaging sensor during application of the time series of beam tilts and cause the one or more processors to generate a set of one or more optical aberration values for the optical system from the sequence of images, wherein at least some of the images in the sequence of images are captured during movement of the charged particle beam between consecutive tilts in the time series of beam tilts.

Example 18 includes the subject matter of Example 17 and further specifies that the one or more computer-readable storage media further store instructions that when executed by the one or more computing devices cause the one or more computing devices to determine induced image shifts in the sequence of images and determine the values for the one or more optical aberrations from the induced image shifts and an applied time series of beam tilts corresponding to the induced image shifts.

Example 19 includes the subject matter of Example 17 and further specifies that the one or more computer-readable storage media further store instructions that when executed by the one or more computing devices cause the one or more computing devices to determine one or more optical corrections for the one or more optical components based on the set of one or more optical aberration values.

Example 20 includes the subject matter of any one of Examples 17-19, and further specifies that the one or more computer-readable storage media further store instructions that when executed by the one or more computing devices cause the one or more computing devices to determine adjustments to the pattern generated by the pattern generator based on a confidence level of the values determined for the one or more optical aberrations.

Example 21 includes the subject matter of any one of Examples 17-20, and further specifies that the pattern generator is configured to generate a periodic pattern.

Example 22 is a method of operating a charged particle beam microscope system including determining a first optical aberration output set, wherein the first aberration output set includes values for a first set of one or more optical aberrations in the charged particle beam microscope system, based on a first input set that includes one or more acquired images; applying adjustments, based on the first optical aberration output set, to the charged particle beam microscope system at a first frequency to mitigate optical aberrations in the first set; determining values for a second optical aberration output set that includes values for a second set of one or more optical aberrations in the charged particle beam system, wherein the one or more optical aberrations of the second set are different than the one or more optical aberrations in the first set, based on a second input set that includes at least some of the first input set or the first optical aberration output; and applying adjustments, based on the second optical aberration output set, to the charged particle beam microscope system at a second frequency to mitigate aberrations in the second set, wherein the second frequency is less than the first frequency.

Example 23 includes the subject matter of Example 22 and further specifies that the first set of one or more optical aberrations includes defocus.

Example 24 includes the subject matter of any one of Examples 22-23 and further specifies that the second set of one or more optical aberrations includes coma or astigmatism.

Example 25 includes the subject matter of any one of Examples 22-24, wherein determining the first optical aberration output set based on the first input set includes determining at least some values for one or more optical aberrations in the second set, and wherein the at least some of the first optical aberration output set included in the second input set includes the at least some values.

The invention claimed is:

1. A method, comprising:
with a charged particle beam microscope system operating in a transmission imaging mode, directing a charged particle beam to a sample including applying a time series of beam tilts in a pattern to the charged particle beam to produce a sequence of images, wherein at least some of the images in the sequence of images are captured while the charged particle beam is transitioning between one beam tilt in the time series of beam tilts and a sequentially adjacent beam tilt in the time series of beam tilts, and wherein the pattern is configured to induce image changes between the images in the sequence of images that are indicative of optical aberrations in the charged particle beam microscope system; and capturing the sequence of images.

2. The method of claim 1, wherein the pattern is a periodic pattern.

3. The method of claim 2, wherein the periodic pattern is a Lissajous figure.

4. The method of claim 1, further comprising generating a set of one or more optical aberration values for the charged particle beam microscope system from the sequence of images.

5. The method of claim 4, wherein the image changes comprise induced image shifts, and wherein generating the set of one or more optical aberration values for the charged particle beam microscope system from the sequence of images comprises measuring the induced image shifts between successive images in the sequence of images.

6. The method of claim 5, wherein generating the set of one or more optical aberration values for the charged particle beam microscope system from the sequence of images further comprises fitting the induced image shifts to an optical aberration model describing a relationship between the induced image shifts, the beam tilts, and the set of one or more optical aberrations.

7. The method of claim 6, wherein the optical aberration model incorporates an unknown time delay between the pattern and the sequence of images.

8. The method of claim 4, wherein generating the set of one or more optical aberration values for the charged particle beam microscope system from the sequence of images comprises estimating a value for one or more of defocus, two-fold astigmatism, three-fold astigmatism, four-fold astigmatism, five-fold astigmatism, sixfold astigmatism, axial coma, fifth order axial coma, spherical aberration, sixth order spherical aberration, star aberration, sixth order star aberration, three-lobe aberration, and rosette aberration.

9. The method of claim 4, further comprising determining optical corrections for the charged particle beam microscope system based on the set of one or more optical aberration values.

10. The method of claim 9, further comprising applying the optical corrections for the charged particle beam microscope system to one or more optical components of the charged particle beam microscope system.

11. The method of claim 4, further comprising adjusting the pattern based on one or more of accuracy of the set of one or more optical aberration values, quality of the images in the sequence of images, and external disturbances while capturing the sequence of images.

12. A charged particle beam microscope system, comprising:
a charged particle source that emits a charged particle beam;
an optical system configured to direct the charged particle beam toward a sample along an optical axis;
a pattern generator configured to generate a pattern;
one or more beam deflectors configured to apply a beam tilt to the charged particle beam upstream of the sample with the charged particle beam microscope system operating in a transmission imaging mode, wherein the one or more beam deflectors are controllable to apply a varying beam tilt to the charged particle beam according to the pattern to produce a sequence of images of the sample corresponding to the variations in the beam tilt such that at least some of the images in the sequence of images are captured while the beam is transitioning between different beam tilts; and
an imaging sensor positioned along the optical axis to capture the sequence of images of the sample, wherein the pattern is configured to induce image changes between the images in the sequence of images that are indicative of optical aberrations in the charged particle beam microscope system.

13. The charged particle beam microscope system of claim 12, wherein the charged particle beam microscope system further is configured to generate a set of one or more optical aberration values for the charged particle beam microscope system from the sequence of images.

14. The charged particle beam microscope system of claim 13, wherein the charged particle beam microscope system further is configured to:
determine optical corrections for the charged particle beam microscope system based on the set of one or more optical aberration values; and
apply the optical corrections for the charged particle beam microscope system to one or more optical components of the charged particle beam microscope system.

15. The charged particle beam microscope system of claim 13, wherein the charged particle beam microscope system further is configured to adjust the pattern based on one or more of accuracy of the set of one or more optical aberration values, quality of the images in the sequence of images, and external disturbances while capturing the sequence of images.

16. One or more computer-readable storage media comprising stored instructions that, when executed by one or more processors coupled to a charged particle beam microscope system, cause the charged particle beam microscope system to:
with the charged particle beam microscope system operating in a transmission imaging mode, direct a charged particle beam to a sample including applying a series of beam tilts to the charged particle beam according to a pattern to produce a sequence of images, wherein at least some of the images in the sequence of images are captured while the charged particle beam is transitioning between different beam tilts of the series of beam tilts, and wherein variations between the images in the sequence of images are correlated to the series of beam tilts in a manner that is indicative of optical aberrations in the charged particle beam microscope system; and
capture the sequence of images.

17. The one or more computer-readable storage media of claim 16, wherein the one or more computer-readable storage media further comprise stored instructions that, when executed by the one or more processors, cause the charged particle beam microscope system to generate a set of one or more optical aberration values for the charged particle beam microscope system based, at least in part, on the sequence of images.

18. The one or more computer-readable storage media of claim 17, wherein the one or more computer-readable storage media further comprise stored instructions that, when executed by the one or more processors, cause the charged particle beam microscope system to determine induced image shifts in the sequence of images and determine the set of one or more optical aberration values from the induced image shifts and the applied series of beam tilts corresponding to the induced image shifts.

19. The one or more computer-readable storage media of claim 17, wherein the one or more computer-readable storage media further comprise stored instructions that, when executed by the one or more processors, cause the charged particle beam microscope system to determine one or more optical corrections for one or more optical components of the charged particle beam microscope system based on the set of one or more optical aberration values.

20. The one or more computer-readable storage media of claim 17, wherein the one or more computer-readable storage media further comprise stored instructions t hat, when executed by the one or more processors, cause the charged particle beam microscope system to determine adjustments to the pattern based on one or more of an accuracy of the set of one or more optical aberration values, quality of the images in the sequence of images, and external disturbances while capturing the sequence of images.

* * * * *

UNITED STATES PATENT AND TRADEMARK OFFICE
CERTIFICATE OF CORRECTION

| | |
|---|---|
| PATENT NO. | : 11,990,315 B2 |
| APPLICATION NO. | : 17/683076 |
| DATED | : May 21, 2024 |
| INVENTOR(S) | : Erik Franken and Bart Jozef Janssen |

It is certified that error appears in the above-identified patent and that said Letters Patent is hereby corrected as shown below:

In the Claims

In Column 21, Claim 20, Line 8, delete "t hat," and insert -- that, --, therefor.

Signed and Sealed this
Twentieth Day of August, 2024

Katherine Kelly Vidal
*Director of the United States Patent and Trademark Office*